United States Patent
Zhong et al.

(10) Patent No.: US 10,382,034 B2
(45) Date of Patent: Aug. 13, 2019

(54) APPARATUS AND METHOD FOR SENSING DISTRIBUTED LOAD CURRENTS PROVIDED BY POWER GATING CIRCUIT

(71) Applicant: QUALCOMM Incorporated, San Diego, CA (US)

(72) Inventors: Guoan Zhong, San Diego, CA (US); Junmou Zhang, San Diego, CA (US); Nan Chen, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 73 days.

(21) Appl. No.: 15/358,494

(22) Filed: Nov. 22, 2016

(65) Prior Publication Data

US 2018/0145686 A1    May 24, 2018

(51) Int. Cl.
| | | |
|---|---|---|
| H03K 17/687 | (2006.01) |
| H03K 19/21 | (2006.01) |
| H03K 3/03 | (2006.01) |
| G06F 1/324 | (2019.01) |
| G01R 19/252 | (2006.01) |
| G06F 1/32 | (2019.01) |

(52) U.S. Cl.
CPC ....... H03K 17/6871 (2013.01); G01R 19/252 (2013.01); G06F 1/32 (2013.01); G06F 1/324 (2013.01); H03K 3/0315 (2013.01); H03K 19/21 (2013.01)

(58) Field of Classification Search
CPC ............ H03K 17/164; H03K 17/6871; H03K 3/0315; G04F 10/005
See application file for complete search history.

(56) References Cited

U.S. PATENT DOCUMENTS

| | | |
|---|---|---|
| 7,123,104 B2 | 10/2006 | Bostak et al. |
| 7,138,819 B2 | 11/2006 | Hashimoto |
| 7,284,137 B2 | 10/2007 | Clark et al. |
| 7,506,184 B2 | 3/2009 | Burton et al. |
| 7,898,278 B2 | 3/2011 | Flynn et al. |
| 8,030,956 B2 | 10/2011 | Otsuga et al. |

(Continued)

OTHER PUBLICATIONS

International Search Report and Written Opinion—PCT/US2017/059532—ISA/EPO—dated Jan. 31, 2018.

*Primary Examiner* — Lincoln D Donovan
*Assistant Examiner* — Colleen J O Toole
(74) *Attorney, Agent, or Firm* — Loza & Loza, LLP/Qualcomm (57) ABSTRACT

An apparatus for sensing distributed load currents provided by power gating circuit. The apparatus includes a power gating circuit including a set of bulk transistors coupled in series with a set of circuits between first and second voltage rails. The apparatus includes a current sensor with a first ring oscillator, a first frequency-to-code (FTC) converter, a second ring oscillator, a second FTC converter, and a subtractor. The first ring oscillator includes a first set of one or more inverters configured to receive a first voltage at a node between the power gating circuit and the first circuit, and a second set of one or more inverters configured to receive a second voltage at a second node between the power gating circuit and the second circuit. The first ring oscillator is configured to generate a signal including a frequency related to the voltage drops across the first and second sets of transistors.

26 Claims, 7 Drawing Sheets

(56) References Cited

U.S. PATENT DOCUMENTS

| | | |
|---|---|---|
| 8,736,314 B2 | 5/2014 | Kim |
| 9,209,822 B2 * | 12/2015 | Teh ....................... H03M 1/068 |
| 9,354,690 B1 | 5/2016 | Joffe et al. |
| 2013/0315021 A1 | 11/2013 | Kondo et al. |
| 2016/0069939 A1 | 3/2016 | Zhang et al. |
| 2016/0116924 A1 | 4/2016 | Meijer et al. |

* cited by examiner

APPARATUS AND METHOD FOR SENSING DISTRIBUTED LOAD CURRENTS PROVIDED BY POWER GATING CIRCUIT

FIELD

Aspects of the present disclosure relate generally to load current sensing, and in particular, to an apparatus and method for sensing distributed load currents provided a by power gating circuit.

BACKGROUND

An integrated circuit (IC) typically includes a power gating circuit for selectively applying power to one or more cores of the IC. Often these cores, such as a central processing unit (CPU) core, a graphics processing unit (GPU) core, modem core, and others, require substantial power to operate. In some cases, such power consumption may get out of control, e.g., becomes too large that may cause damage to the IC or may cause the IC to malfunction.

To prevent damage to the IC or IC malfunction, ICs typically include a current sensing circuit to sense a load current supplied to one or more cores, and a controller to perform one or more defined operations when the sensed load current exceeds a threshold, the temperature of the IC exceeds a threshold, and/or based on other conditions. For example, such one or more defined operations may include reducing the clock frequency so that less current is supplied to the one or more cores.

SUMMARY

The following presents a simplified summary of one or more embodiments in order to provide a basic understanding of such embodiments. This summary is not an extensive overview of all contemplated embodiments, and is intended to neither identify key or critical elements of all embodiments nor delineate the scope of any or all embodiments. Its sole purpose is to present some concepts of one or more embodiments in a simplified form as a prelude to the more detailed description that is presented later.

An aspect of the disclosure relates to an apparatus including a first circuit; a second circuit; a power gating circuit configured to generate a first load current through the first circuit and a second load current through the second circuit; a current sensor configured to generate a first signal related to the first load current and the second load current, wherein the current sensor includes a first ring oscillator including: a first set of one or more inverters coupled to a first node between the power gating circuit and the first circuit, and a second set of one or more inverters coupled to a second node between the power gating circuit and the second circuit.

Another aspect of the disclosure relates to a method including generating a first load current through a first circuit and a power gating circuit; generating a second load current through a second circuit and the power gating circuit; generating a first signal related to the first load current and the second load current, wherein generating the first signal comprises: applying a first voltage at a first node between the first circuit and the power gating circuit to a first set of one or more inverters of a first ring oscillator; and applying a second voltage at a second node between the second circuit and the power gating circuit to a second set of one or more inverters of the first ring oscillator.

Another aspect of the disclosure relates to apparatus including means for generating a first load current through a first circuit; means for generating a second load current through a second circuit; means for generating a first signal related to the first load current and the second load current, wherein generating the first signal includes means for applying a first voltage at a first node between the first circuit and the means for generating the first load current to a first set of one or more inverters of a means for generating a second signal; and means for applying a second voltage at a second node between the second circuit and the means for generating the second load current to a second set of one or more inverters of the means for generating the second signal.

To the accomplishment of the foregoing and related ends, the one or more embodiments include the features hereinafter fully described and particularly pointed out in the claims. The following description and the annexed drawings set forth in detail certain illustrative aspects of the one or more embodiments. These aspects are indicative, however, of but a few of the various ways in which the principles of various embodiments may be employed and the description embodiments are intended to include all such aspects and their equivalents.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts.

Figure 1:
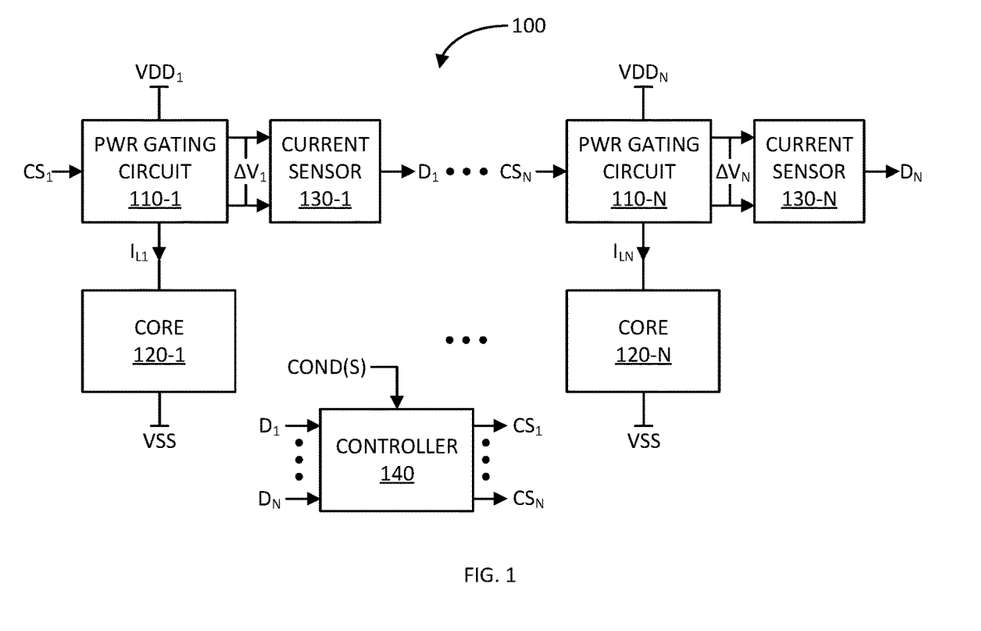
FIG. 1 illustrates a block diagram of an exemplary apparatus for sensing and controlling distributed load currents provided by a power gating circuit in accordance with an aspect of the disclosure.

FIG. 1 illustrates a block diagram of an exemplary apparatus 100 for sensing and controlling one or more load currents provided by one or more respective power gating circuits in accordance with an aspect of the disclosure. The apparatus 100 may be employed in an integrated circuit (IC) for sensing one or more load currents supplied to one or more cores.

In particular, the apparatus 100 includes N number of power gating circuits 110-1 to 110-N, where N may be one (1) or more. The power gating circuits 110-1 to 110-N may be coupled in series with cores (generally circuits) 120-1 to 120-N between upper voltage rails $VDD_1$ to $VDD_N$ and a lower voltage rail VSS (e.g., ground), respectively. The power gating circuits 110-1 to 110-N are configured to receive control signals $CS_1$ to $CS_N$ for controlling the load currents $I_{L1}$ to $I_{LN}$ supplied to the cores 120-1 to 120-N, respectively.

The apparatus 100 further includes current sensors 130-1 to 130-N coupled to power gating circuits 110-1 to 110-N, respectively. The current sensors 130-1 to 130-N are configured to generate digital signals $D_1$ to $D_N$ indicative of the load currents $I_{L1}$ to $I_{LN}$ supplied to the cores 120-1 to 120-N, respectively. The current sensors 130-1 to 130-N are configured to generate the digital signals $D_1$ to $D_N$ based on voltage differences $\Delta V_1$ to $\Delta V_N$ generated by the power gating circuits 110-1 to 110-N, respectively. Accordingly, the voltage differences $\Delta V_1$ to $\Delta V_N$ are related to the load currents $I_{L1}$ to $I_{LN}$ supplied to the cores 120-1 to 120-N, respectively.

The apparatus 100 further includes a controller 140 for controlling the operations of the power gating circuits 110-1 to 110-N. For example, the controller 140 may be configured to control any one of the power gating circuits 110-1 to 110-N to reduce or substantially eliminate any corresponding load currents $I_{L1}$ to $I_{LN}$ supplied to any corresponding cores 120-1 to 120-N.

More specifically, the controller 140 is configured to receive the digital signals $D_1$ to $D_N$ from the current sensors 130-1 to 130-N. The controller 140 is further configured to generate control signals $CS_1$ to $CS_N$ for the power gating circuits 110-1 to 110-N, respectively. Optionally, the controller 140 may be configured to receive one or more conditions, such as one or more signals indicative of one or more sensed temperatures associated with the apparatus 100 and/or other one or more signals to which the controller 140 may respond in controlling the operation of the power gating circuits 110-1 to 110-N.

In operation, if the controller 140 senses that any one or more of the digital signals $D_1$ to $D_N$ exceeds any one or more current thresholds, which may result in any one or more harmful load currents $I_{L1}$ to $I_{LN}$ supplied to the corresponding cores 120-1 to 120-N, the controller 140 generates the control signals $CS_1$ to $CS_N$ to reduce or substantially eliminate the corresponding any or more harmful load currents $I_{L1}$ to $I_{LN}$. Alternatively, or in addition to, if the controller 140 senses that any one or more conditions would result in damage to or malfunction of the apparatus 100 if any of the load currents $I_{L1}$ to $I_{LN}$ are maintained, the controller 140 generates the control signals $CS_1$ to $CS_N$ to reduce or substantially eliminate the corresponding one or more of the load currents $I_{L1}$ to $I_{LN}$ that would otherwise produce the damage to or malfunction of the apparatus 100.

Figure 2:
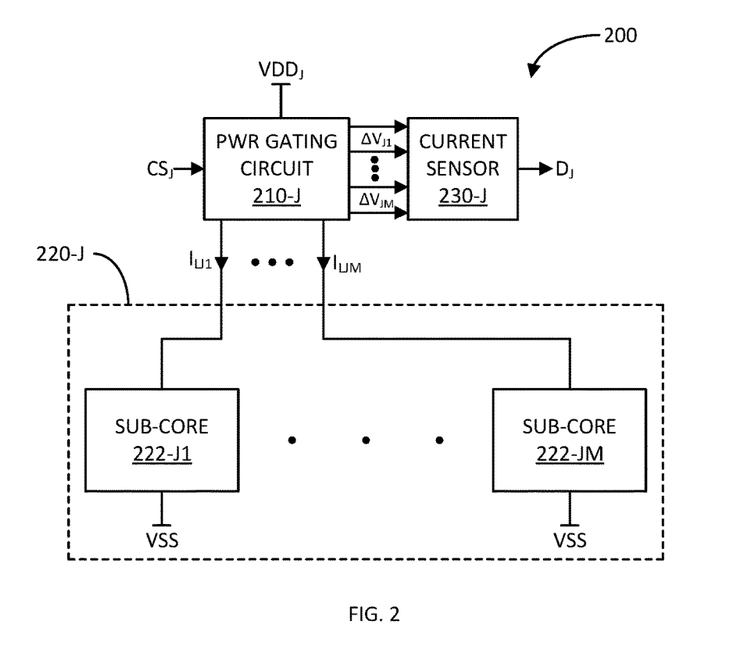
FIG. 2 illustrates a block diagram of another exemplary apparatus for sensing distributed load currents provided by a power gating circuit in accordance with another aspect of the disclosure.

FIG. 2 illustrates a block diagram of another exemplary apparatus 200 for sensing distributed load currents provided by a power gating circuit in accordance with another aspect of the disclosure. The apparatus 200 may be an exemplary more detailed implementation of a portion of the apparatus 100 previously discussed. For example, the apparatus 200 may include the Jth power gating circuit, the Jth current sensor, and the Jth core of the apparatus 100, where J can be any integer between 1 and N.

More specifically, the apparatus 200 includes a power gating circuit 210-J, a current sensor 230-J, and a core 220-J. The core 220-J, in turn, includes sub-cores (generally circuits) 222-J1 to 220-JM, where M may be two (2) or more. The power gating circuit 210-J is coupled in series with the respective sub-cores 222-J1 to 222-JM between an upper voltage rail $VDD_J$ and a lower voltage rail VSS. The power gating circuit 210-J is configured to control load currents $I_{LJ1}$ to $I_{LJM}$ distributed to the sub-cores 222-J1 to 222-JM in response to a control signal $CS_J$, respectively.

The current sensor 230-J is configured to generate a digital signal $D_J$ indicative of a combination (e.g., average or sum) of the load currents $I_{LJ1}$ to $I_{LJM}$ distributed to the sub-cores 222-J1 to 222-JM, respectively. The current sensor 230-J is configured to generate the digital signal $D_J$ based on a set of voltage differences $\Delta V_{J1}$ to $\Delta V_{J1}$ generated by the power gating circuit 210-J. Accordingly, the voltage differences $\Delta V_{J1}$ to $\Delta V_{J1}$ are related to the load currents $I_{LJ1}$ to $I_{LJM}$ supplied to the sub-cores 222-J1 to 222-JM, respectively. Thus, the digital signal $D_J$ is related to a combination of the load currents $I_{LJ1}$ to $I_{LJM}$.

As in apparatus 100, the digital signal $D_J$ may be provided to a controller for generating the control signal $CS_J$ for controlling the load currents $I_{LJ1}$ to $I_{LJM}$ supplied to the sub-cores 222-J1 to 222-JM, respectively. As discussed, the controller may generate the control signal $CS_J$ to prevent damage to or malfunction of the sub-cores 222-J1 and 222-JM. As an example, the controller may generate the control signal $CS_J$ to collectively reduce or substantially eliminate the load currents $I_{LJ1}$ to $I_{LJM}$ supplied to the sub-cores 222-J1 to 222-JM.

Figure 3:
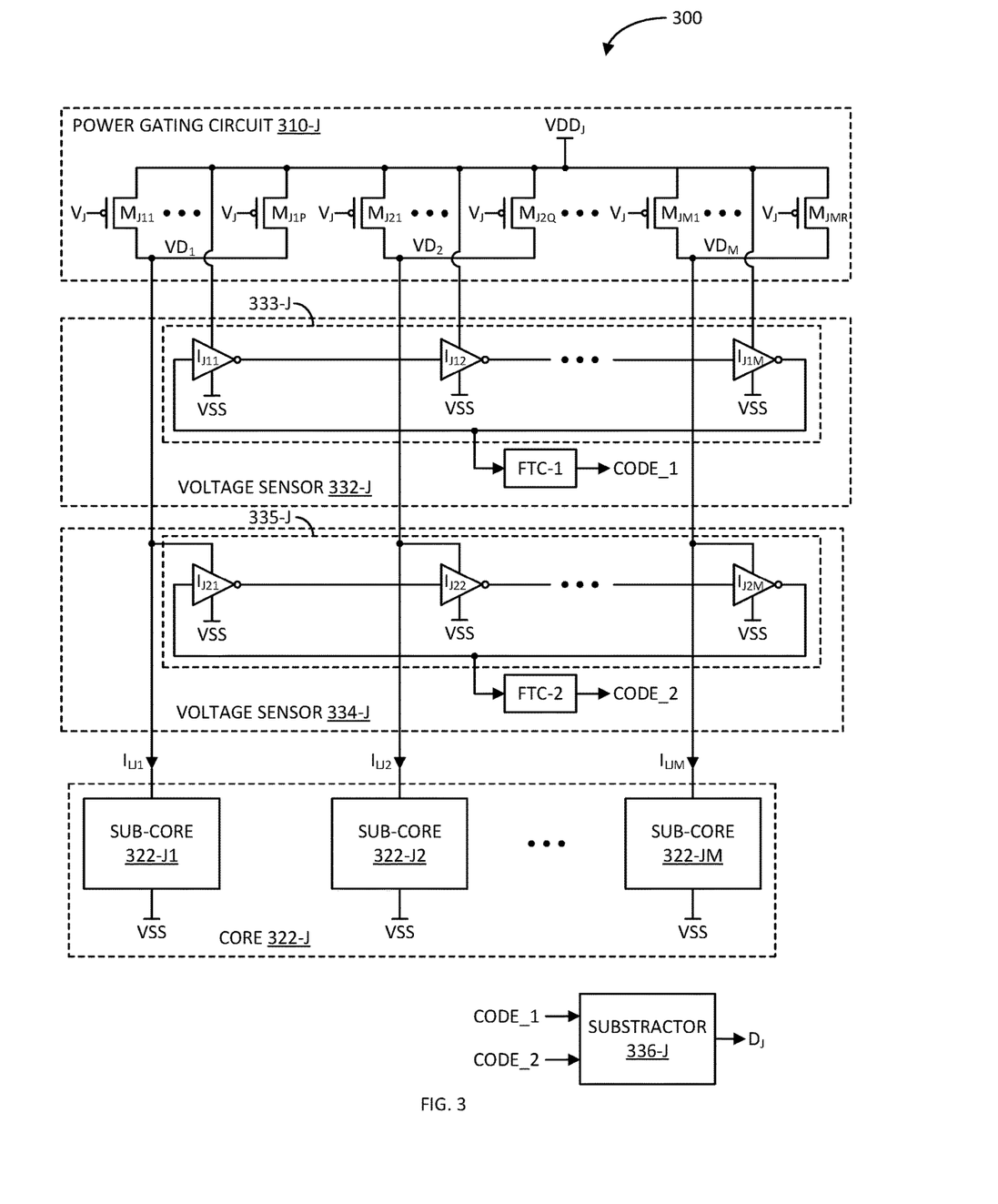
FIG. 3 illustrates a block diagram of another exemplary apparatus for sensing distributed load currents provided by a power gating circuit in accordance with another aspect of the disclosure.

FIG. 3 illustrates a block diagram of another exemplary apparatus 300 for sensing distributed load currents by a power gating circuit in accordance with another aspect of the disclosure. The apparatus 300 may be an exemplary detailed implementation of the apparatus 200 previously discussed. In particular, the apparatus 300 includes a power gating circuit 310-J, a current sensor including voltage sensors 332-J and 334-J and subtractor 336-J, and a core 322-J including a set of sub-cores 322-J1, 322-J2 to 322-JM.

The power gating circuit 310-J includes a first set of one or more bulk head transistors $M_{J11}$ to $M_{J1P}$ coupled in parallel with each other. The first set of one or more bulk head transistors $M_{J11}$ to $M_{J1P}$ are coupled in series with sub-core 322-J1 between an upper voltage rail $VDD_J$ and a lower voltage rail VSS. Each of the bulk head transistors $M_{J11}$ to $M_{J1P}$ may be configured as a p-channel metal oxide semiconductor (PMOS) field effect transistor (FET). The control terminals (e.g., gates) of the bulk head transistors $M_{J11}$ to $M_{J1P}$ are configured to receive control voltage $V_J$ (an example of control signal $CS_J$).

Similarly, the power gating circuit 3104 further includes a second set of one or more bulk head transistors $M_{J21}$ to $M_{J2Q}$ coupled in parallel with each other. The second set of one or more bulk head transistors $M_{J21}$ to $M_{J2Q}$ are coupled in series with sub-core 322-J2 between the upper voltage rail $VDD_J$ and the lower voltage rail VSS. Each of the bulk head transistors $M_{J21}$ to $M_{J2Q}$ may be configured as a PMOS FET. The control terminals (e.g., gates) of the bulk head transistors $M_{J21}$ to $M_{J2Q}$ are configured to receive control voltage $V_J$. The number Q of bulk head transistors $M_{J21}$ to $M_{J2Q}$ in the second set may be the same or different than the number P of transistors $M_{J11}$ to $M_{J1P}$ in the first set.

In a like manner, the power gating circuit 3104 further includes an Mth set of one or more bulk head transistors $M_{JM1}$ to $M_{JMR}$ coupled in parallel with each other. The Mth set of one or more bulk head transistors $M_{JM1}$ to $M_{JMR}$ are coupled in series with sub-core 322-JM between the upper voltage rail $VDD_J$ and the lower voltage rail VSS. Each of the bulk head transistors $M_{JM1}$ to $M_{JMR}$ may be configured as a PMOS FET. The control terminals (e.g., gates) of the bulk head transistors $M_{JM1}$ to $M_{JMR}$ are configured to receive control voltage $V_J$. The number R of bulk head transistors $M_{JM1}$ to $M_{JMR}$ in the Mth set may be the same or different than the number P of transistors $M_{J11}$ to $M_{J1P}$ in the first set and/or the number Q of transistors $M_{J21}$ to $M_{J2Q}$ in the second set.

As discussed, the current sensor includes voltage sensors 332-J and 334-J, and subtractor 336-J. The voltage sensor 332-J, in turn, includes a ring oscillator 333-J with a cascaded set of odd number of inverters $I_{J11}$ to $I_{J1M}$. The output of the last inverter $I_{J1M}$ is coupled to the input of the first inverter $I_{J11}$ via a feedback path. The inverters $I_{J11}$ to $I_{J1M}$ are each coupled between the upper voltage rail $VDD_J$ and the lower voltage VSS.

The voltage sensor 332-J further includes a first frequency-to-code converter FTC-1 configured to generate a first digital signal CODE_1 related to the frequency of the signal generated by the ring oscillator 333-J. The frequency of the signal generated by the ring oscillator 333-J is a function of the voltage difference between the rail voltages $VDD_J$ and VSS. Accordingly, the first digital signal CODE_1 is indicative of the voltage difference ($VDD_J$-VSS). In this example, the first frequency-to-code converter FTC-1 is coupled to the feedback path of the ring oscillator 333-J; but as exemplified further herein, may be coupled to multiple nodes of the ring oscillator 333-J.

Similarly, the voltage sensor 334-J includes a ring oscillator 335-J with a cascaded set of odd number of inverters $I_{J21}$ to $I_{J2M}$. The output of the last inverter $I_{J2M}$ is coupled to the input of the first inverter $I_{J21}$ via a feedback path. The inverters $I_{J21}$ to $I_{J1M}$ are coupled between the lower terminals (e.g., drains) of the first set of transistors $M_{J11}$ to $M_{J1P}$ to the Mth sets of transistors $M_{JM1}$ to $M_{JMR}$ and the lower voltage rail, respectively.

The voltage sensor 334-J further includes a second frequency-to-code converter FTC-2 configured to generate a second digital signal CODE_2 indicative of the frequency of the signal generated by the ring oscillator 335-J. The frequency of the signal generated by the ring oscillator 335-J is a function of a combination (e.g., average) of the voltage differences between the lower terminal (e.g., drain) voltages $VD_1$ and $VD_M$ of the first to the Mth sets of bulk head transistors and the lower rail voltage VSS. Accordingly, the second digital signal CODE_2 is indicative of the combination (e.g., average) of the voltage differences ($VD_1$-VSS) to ($VD_M$-VSS). In this example, the second frequency-to-code converter FTC-2 is coupled to the feedback path of the ring oscillator 335-J; but as exemplified further herein, may be coupled to multiple nodes of the ring oscillator 335-J.

As discussed, the current sensor further includes the subtractor 336-J. The subtractor 336-J is configured to generate a digital signal $D_J$ related to a difference between the first and second digital signals CODE_1 and CODE_2 (e.g., $D_J$=CODE_1−CODE_2). The digital signal $D_J$ may be related to the combination (e.g., average or sum) of the load currents $I_{LJ1}$ to $I_{LJM}$ distributed to the sub-cores 322-J1 to 322-JM by the power gating circuit 310-J, respectively.

As an example, the first digital signal CODE_1 is related to a ($VDD_J$-VSS). The second digital signal CODE_2 is related to the average {$VD_1$ to $VD_M$}-VSS. The digital signal $D_J$ is related to CODE_1−CODE_2. Thus, the digital signal $D_J$ is related to ($VDD_J$-VSS)−(average{$VD_1$ to $VD_M$}-VSS). Accordingly, the digital signal $D_J$ is related to $VDD_J$−average{$VD_1$ to $VD_M$}. As the term $VDD_J$−average{$VD_1$ to $VD_M$} is the average voltage drop across the first to Mth sets of bulk head transistors, this term is related to the average of the load currents $I_{LJ1}$ to $I_{LJM}$ supplied to the sub-cores 322-J1 to 322-JM, respectively.

Figure 4:
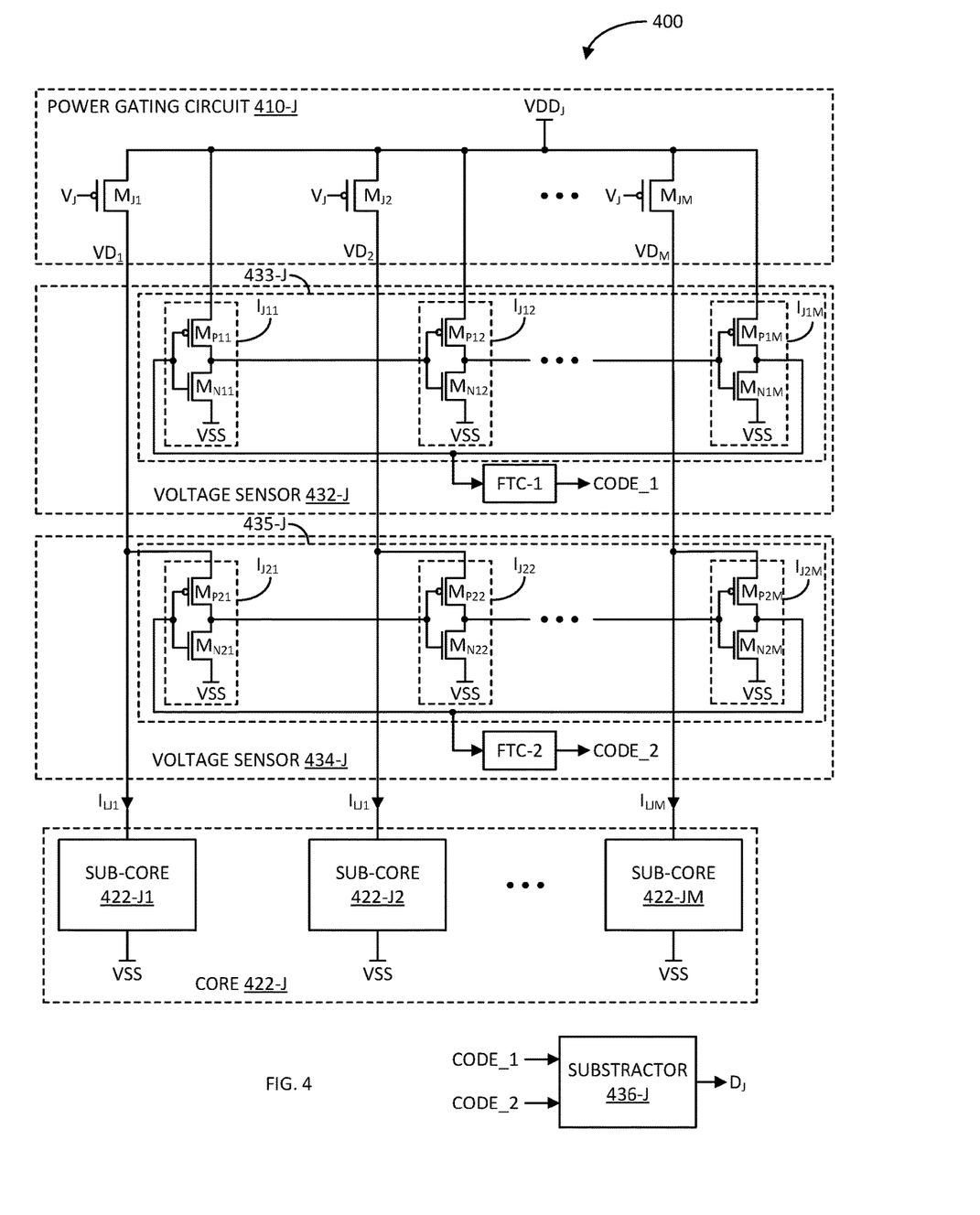
FIG. 4 illustrates a block diagram of another exemplary apparatus for sensing distributed load currents provided by a power gating circuit in accordance with another aspect of the disclosure.

Thus, a controller may use the digital signal $D_J$ to control the load currents $I_{LJ1}$ to $I_{LJM}$ supplied to the sub-cores 322-J1 to 322-JM FIG. 4 illustrates a block diagram of another exemplary apparatus 400 for sensing distributed load currents provided by a power gating circuit in accordance with another aspect of the disclosure. The apparatus 400 may be an exemplary more detailed implementation of the apparatus 300 previously discussed. In particular, the apparatus 400 includes a power gating circuit 410-J, a current sensor including voltage sensors 432-J and 434-J and subtractor 436-J, and a core 422-J including a set of sub-cores 422-J1, 422-J2 to 422-JM.

In this example, the power gating circuit 410-J includes a set of bulk head transistors $M_{J1}$ to $M_{JM}$. The first bulk head transistor $M_{J1}$ is coupled in series with sub-core 422-J1 between an upper voltage rail $VDD_J$ and a lower voltage rail VSS. The second bulk head transistor $M_{J2}$ is coupled in series with sub-core 422-J2 between the upper voltage rail $VDD_J$ and the lower voltage rail VSS. Similarly, the Mth bulk head transistor $M_{JM}$ is coupled in series with sub-core 422-JM between the upper voltage rail $VDD_J$ and the lower voltage rail VSS. Each of the bulk head transistors $M_{J1}$ to $M_{JM}$ may be configured as a PMOS FET. The control terminals (e.g., gates) of the bulk head transistors $M_{J1}$ to $M_{J1M}$ are configured to receive control voltage $V_J$ (an example of control signal $CS_J$).

As discussed, the current sensor includes voltage sensors 432-J and 434-J, and subtractor 436-J. The voltage sensor 432-J, in turn, includes a ring oscillator 433-J with a cascaded set of odd number of inverters $I_{J11}$ to $I_{J1M}$. Each of the inverter includes a PMOS FET coupled in series with an n-channel metal oxide semiconductor (NMOS) FET between the upper voltage rail $VDD_J$ and the lower voltage rail VSS. The gates of the PMOS and NMOS FETs are coupled together to form an input of the corresponding inverter. The drains of the PMOS and NMOS FETs are coupled together to form an output of the corresponding inverter.

For instance, inverter $I_{J11}$ includes PMOS $M_{P11}$ and NMOS $M_{N11}$; inverter $I_{J12}$ includes PMOS $M_{P12}$ and NMOS $M_{N12}$; and inverter $I_{J1M}$ includes PMOS $M_{P1M}$ and NMOS $M_{N1M}$. The output (drains of PMOS $M_{P1M}$ and NMOS $M_{N1M}$) of the last inverter $I_{J1M}$ is coupled to the input (gates of PMOS $M_{P11}$ and NMOS $M_{N11}$) of the first inverter $I_{J11}$ via a feedback path.

The voltage sensor 432-J further includes a first frequency-to-code converter FTC-1 configured to generate a first digital signal CODE_1 indicative the frequency of the signal generated by the ring oscillator 433-J. The frequency of the signal generated by the ring oscillator 433-J is a function of the voltage difference between the rail voltages $VDD_J$ and VSS. Accordingly, the first digital signal CODE_1 is indicative of the voltage difference ($VDD_J$-VSS). In this example, the first frequency-to-code converter FTC-1 is coupled to the feedback path of the ring oscillator 433-J; but as exemplified further herein, may be coupled to multiple nodes of the ring oscillator 433-J.

Similarly, the voltage sensor 434-J includes a ring oscillator 435-J including a cascaded set of odd number of inverters $I_{J21}$ to $I_{J2M}$. Each of the inverter includes a PMOS FET coupled in series with an NMOS FET between the respective lower terminals (e.g., drains) of bulk head transistors $M_{J1}$ to $M_{JM}$ and the lower voltage rail VSS. The gates of the PMOS and NMOS FETs are coupled together to form an input of the corresponding inverter. The drains of the PMOS and NMOS FETs are coupled together to form an output of the corresponding inverter.

For instance, inverter $I_{J21}$ includes PMOS $M_{P21}$ and NMOS $M_{N21}$; inverter $I_{J22}$ includes PMOS $M_{P22}$ and NMOS $M_{N22}$; and inverter $I_{J2M}$ includes PMOS $M_{P2M}$ and NMOS $M_{N2M}$. The output (drains of PMOS $M_{P2M}$ and NMOS $M_{N2M}$) of the last inverter $I_{J2M}$ is coupled to the input (gates of PMOS $M_{P21}$ and NMOS $M_{N21}$) of the first inverter $I_{J11}$ via a feedback path.

The voltage sensor 434-J further includes a second frequency-to-code converter FTC-2 configured to generate a second digital signal CODE_2 indicative of the frequency of the signal generated by the ring oscillator 435-J. The frequency of the signal generated by the ring oscillator 435-J is a function of a combination (e.g., average) of the voltage differences between the lower terminal (e.g., drain) voltages $VD_1$ and $VD_M$ of the respective bulk head transistors $M_{J1}$ to $M_{JM}$ and the lower rail voltage VSS. Accordingly, the second digital signal CODE_2 is indicative of the combination (e.g., average) of the voltage differences ($VD_1$–VSS) to ($VD_M$–VSS). In this example, the second frequency-to-code converter FTC-2 is coupled to the feedback path of the ring oscillator 435-J; but as exemplified further herein, may be coupled to multiple nodes of the ring oscillator 435-J.

As discussed, the current sensor further includes the subtractor 436-J. The subtractor 436-J is configured to generate a digital signal $D_J$ related to a difference between the first and second digital signals CODE_1 and CODE_2 (e.g., $D_J$=CODE_1–CODE_2). The digital signal $D_J$ may be related to the combination (e.g., average or sum) of the load currents $I_{LJ1}$ to $I_{LJM}$ distributed to the sub-cores 422-J1 to 422-JM by the power gating circuit 410-J, respectively.

As an example, the first digital signal CODE_1 is related to ($VDD_J$–VSS). The second digital signal CODE_2 is related to the average{$VD_1$ to $VD_M$}–VSS. The digital signal $D_J$ is related to CODE_1–CODE_2. Thus, the digital signal $D_J$ is related to ($VDD_J$–VSS)–(average{$VD_1$ to $VD_M$}–VSS). Accordingly, the digital signal $D_J$ is related to $VDD_J$–average{$VD_1$ to $VD_M$}. As the term $VDD_J$–average{$VD_1$ to $VD_M$} is the average voltage drop across the bulk head transistors $M_{J1}$ to $M_{JM}$, this term is related to the average or sum of the load currents $I_{LJ1}$ to $I_{LJM}$ supplied to the sub-cores 422-J1 to 422-JM, respectively.

Thus, a controller may use the digital signal $D_J$ to control the load currents $I_{LJ1}$ to $I_{LJM}$ supplied to the sub-cores 422-J1 to 422-JM.

Figure 5:
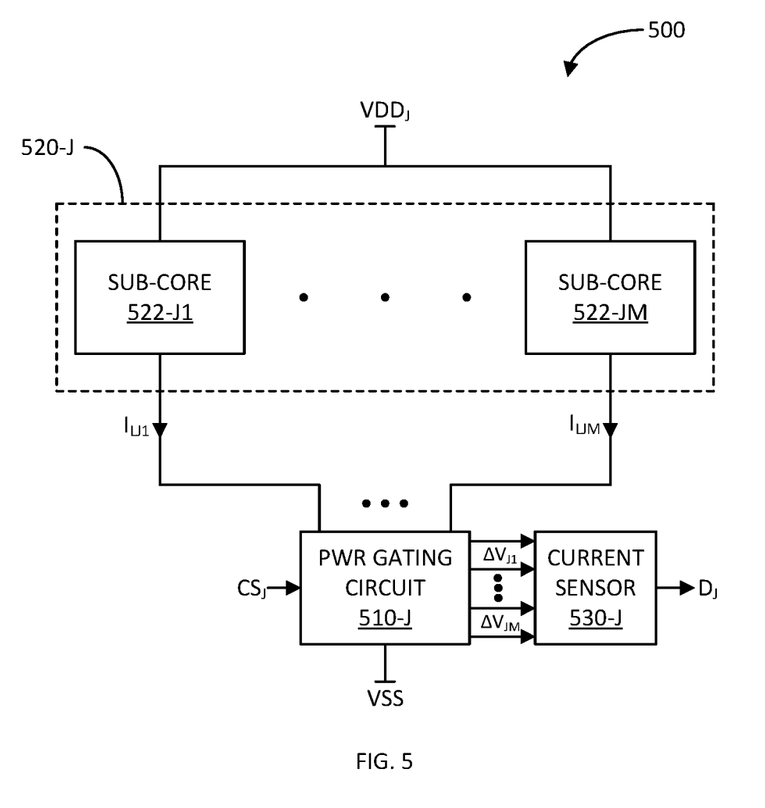
FIG. 5 illustrates a block diagram of another exemplary apparatus for sensing distributed load currents provided by a power gating circuit in accordance with another aspect of the disclosure.

FIG. 5 illustrates a block diagram of another exemplary apparatus 500 for sensing distributed load currents by a power gating circuit in accordance with another aspect of the disclosure. The apparatus 500 is a variation of apparatus 200 previously discussed. In particular, the apparatus 500 includes a power gating circuit between a core and a lower voltage rail VSS, instead of between an upper voltage rail and a core as in apparatus 200.

More specifically, the apparatus 500 includes a power gating circuit 510-J, a current sensor 530-J, and a core 520-J. The core 520-J, in turn, includes sub-cores (generally circuits) 522-J1 to 520-JM, where M may be two (2) or more. The sub-cores 522-J1 to 522-JM are respectively coupled in series with the power gating circuit 510-J between an upper voltage rail $VDD_J$ and a lower voltage rail VSS. The power gating circuit 510-J is configured to control load currents $I_{LJ1}$ to $I_{LJM}$ through to the sub-cores 522-J1 to 522-JM in response to a control signal $CS_J$, respectively.

The current sensor 530-J is configured to generate a digital signal $D_J$ indicative of a combination (e.g., average or sum) of the load currents $I_{LJ1}$ to $I_{LJM}$ through to the sub-cores 522-J1 to 522-JM, respectively. The current sensor 530-J is configured to generate the digital signal $D_J$ based on a set of voltage difference $\Delta V_{J1}$ to $\Delta V_{JM}$ generated by the power gating circuit 510-J. Accordingly, the voltage differences $\Delta V_{J1}$ to $\Delta V_{JM}$ are related to the load currents $I_{LJ1}$ to $I_{LJM}$ through to the sub-cores 522-J1 to 522-JM, respectively. Thus, the digital signal $D_J$ is related to a combination of the load currents $I_{LJ1}$ to $I_{LJM}$.

Figure 6:
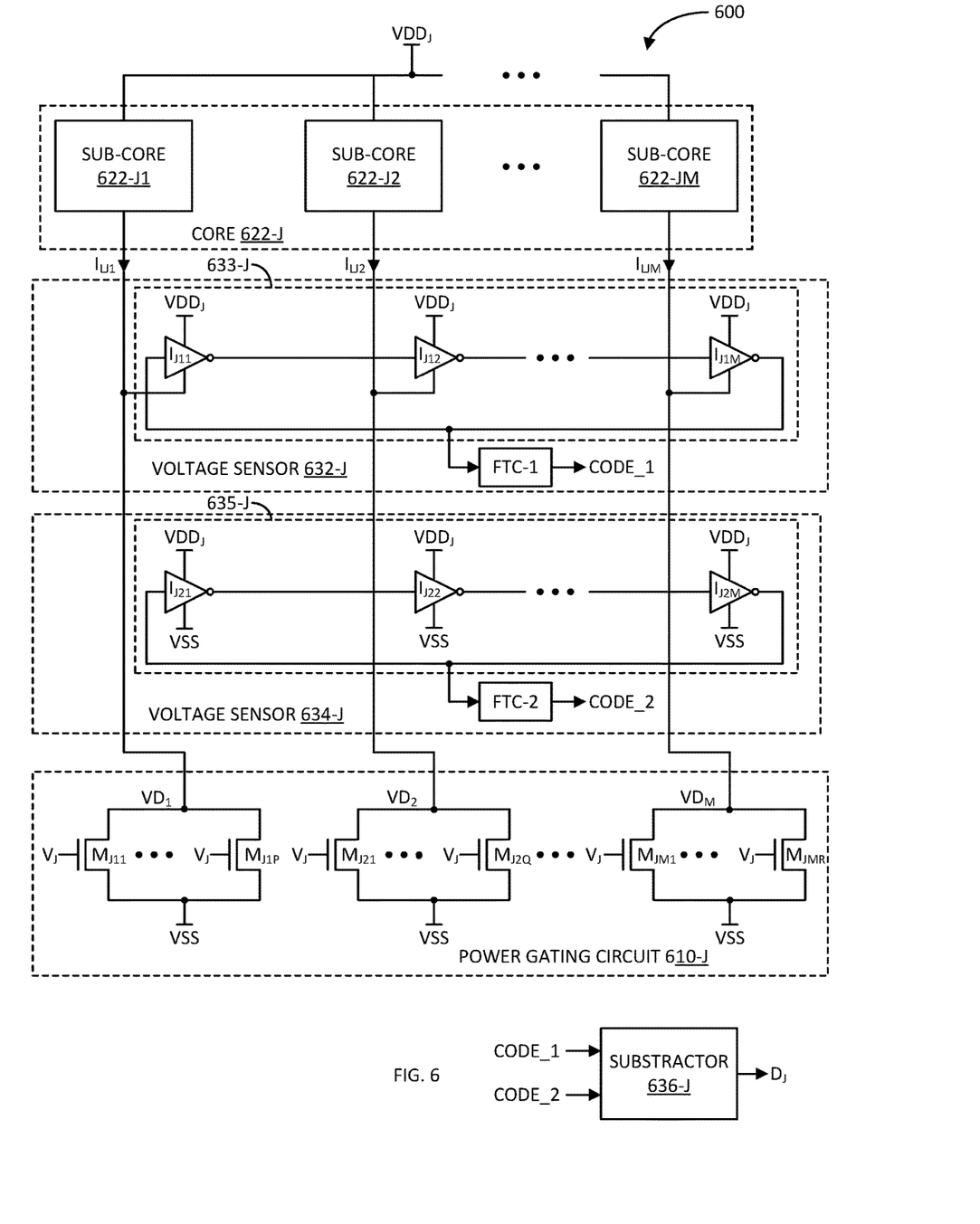
FIG. 6 illustrates a block diagram of another exemplary apparatus for sensing distributed load currents provided by a power gating circuit in accordance with another aspect of the disclosure.

FIG. 6 illustrates a block diagram of another exemplary apparatus 600 for sensing distributed load currents provided by a power gating circuit in accordance with another aspect of the disclosure. The apparatus 600 may be an exemplary detailed implementation of the apparatus 500 previously discussed. In particular, the apparatus 600 includes a power gating circuit 610-J, a current sensor including voltage sensors 632-J and 634-J and subtractor 636-J, and a core 622-J including a set of sub-cores 622-J1, 622-J2 to 622-JM.

The power gating circuit 610-J includes a first set of one or more bulk footer transistors $M_{J11}$ to $M_{J1P}$ coupled in parallel with each other. The sub-core 622-J1 is coupled in series with the first set of one or more bulk footer transistors $M_{J11}$ to $M_{J1P}$ with between an upper voltage rail $VDD_J$ and a lower voltage rail VSS. Each of the bulk footer transistors $M_{J11}$ to $M_{J1P}$ may be configured as an NMOS FET. The control terminals (e.g., gates) of the bulk footer transistors $M_{J11}$ to $M_{J1P}$ are configured to receive control voltage $V_J$ (an example of control signal $CS_J$).

Similarly, the power gating circuit 610-J further includes a second set of one or more bulk footer transistors $M_{J21}$ to $M_{J2Q}$ coupled in parallel with each other. The sub-core 622-J2 is coupled in series with the second set of one or more bulk footer transistors $M_{J21}$ to $M_{J2Q}$ between the upper voltage rail $VDD_J$ and the lower voltage rail VSS. Each of the bulk footer transistors $M_{J21}$ to $M_{J2Q}$ may be configured as an NMOS FET. The control terminals (e.g., gates) of the bulk footer transistors $M_{J21}$ to $M_{J2Q}$ are configured to receive control voltage $V_J$. The number Q of bulk footer transistors $M_{J21}$ to $M_{J2Q}$ in the second set may be the same or different than the number P of transistors $M_{J11}$ to $M_{J1P}$ in the first set.

In a like manner, the power gating circuit 610-J further includes an Mth set of one or more bulk footer transistors $M_{JM1}$ to $M_{JMR}$ coupled in parallel with each other. The sub-core 622-JM is coupled in series with the Mth set of one or more bulk footer transistors $M_{JM1}$ to $M_{JMR}$ between the upper voltage rail $VDD_J$ and the lower voltage rail VSS. Each of the bulk footer transistors $M_{JM1}$ to $M_{JMR}$ may be configured as an NMOS FET. The control terminals (e.g., gates) of the bulk footer transistors $M_{JM1}$ to $M_{JMR}$ are configured to receive control voltage $V_J$. The number R of bulk footer transistors $M_{JM1}$ to $M_{JMR}$ in the Mth set may be the same or different than the number P of transistors $M_{J11}$ to $M_{J1P}$ in the first set and/or the number Q of transistors $M_{J21}$ to $M_{J2Q}$ in the second set.

As discussed, the current sensor includes voltage sensors 632-J and 634-J, and subtractor 636-J. The voltage sensor 632-J includes a ring oscillator 633-J with a cascaded set of odd number of inverters $I_{J11}$ to $I_{J1M}$. The output of the last inverter $I_{J1M}$ is coupled to the input of the first inverter $I_{J11}$ via a feedback path. The inverters $I_{J11}$ to $I_{J1M}$ are coupled between the upper voltage rail $VDD_J$ and the upper terminals (e.g., drains) of the first set of transistors $M_{J11}$ to $M_{J1P}$ to the Mth set of transistors $M_{JM1}$ to $M_{JMR}$, respectively.

The voltage sensor 632-J further includes a first frequency-to-code converter FTC-1 configured to generate a first digital signal CODE_1 indicative of the frequency of the signal generated by the ring oscillator 633-J. The frequency of the signal generated by the ring oscillator 633-J is a function of a combination (e.g., average) of the voltage differences between the upper rail voltage $VDD_J$ and the upper terminal (e.g., drain) voltages $VD_1$ and $VD_M$ of the first to Mth sets of bulk footer transistors. Accordingly, the first digital signal CODE_1 is indicative of the combination (e.g., average) of the voltage differences ($VDD_J$–$VD_1$) to ($VDD_J$–$VD_M$). In this example, the first frequency-to-code converter FTC-1 is coupled to the feedback path of the ring oscillator 633-J; but as exemplified further herein, may be coupled to multiple nodes of the ring oscillator 633-J.

The voltage sensor 634-J includes a ring oscillator 635-J with a cascaded set of odd number of inverters $I_{J21}$ to $I_{J2M}$. The output of the last inverter $I_{J2M}$ is coupled to the input of the first inverter $I_{J21}$ via a feedback path. The inverters $I_{J21}$ to $I_{J2M}$ are each coupled between the upper voltage rail $VDD_J$ and the lower voltage VSS.

The voltage sensor 634-J further includes a second frequency-to-code converter FTC-2 configured to generate a second digital signal CODE_2 indicative the frequency of the signal generated by the ring oscillator 635-J. The frequency of the signal generated by the ring oscillator 635-J is a function of the voltage difference between the rail voltages $VDD_J$ and VSS. Accordingly, the second digital signal CODE_2 is indicative of the voltage difference ($VDD_J$–VSS). In this example, the second frequency-to-code converter FTC-2 is coupled to the feedback path of the ring oscillator 635-J; but as exemplified further herein, may be coupled to multiple nodes of the ring oscillator 635-J.

As discussed, the current sensor further includes the subtractor 636-J. The subtractor 636-J is configured to generate a digital signal $D_J$ related to a difference between the first and second digital signals CODE_1 and CODE_2 (e.g., $D_J$=CODE_1–CODE_2). The digital signal $D_J$ may be related to the combination (e.g., average or sum) of the load currents $I_{LJ1}$ to $I_{LJM}$ through to the sub-cores 622-J1 to 622-JM provided by the power gating circuit 610-J, respectively.

As an example, the first digital signal CODE_1 is related to the $VDD_J$–average{$VD_1$ to $VD_M$}. The second digital signal CODE_2 is related to ($VDD_J$–VSS). The digital signal $D_J$ is related to CODE_1–CODE_2. Thus, the digital signal $D_J$ is related to $VDD_J$–average{$VD_1$ to $VD_M$}–($VDD_J$–VSS). Accordingly, the digital signal $D_J$ is related to {$VD_1$ to $VD_M$}–VSS. As the term average{$VD_1$ to $VD_M$}–VSS is the average voltage drop across the first to Mth sets of bulk footer transistors, this term is related to the average or sum of the load currents $I_{LJ1}$ to $I_{LJM}$ through to the sub-cores 622-J1 to 622-JM, respectively.

Thus, a controller may use the digital signal $D_J$ to control the load currents $I_{LJ1}$ to $I_{LJM}$ through to the sub-cores 622-J1 to 622-JM.

Figure 7:
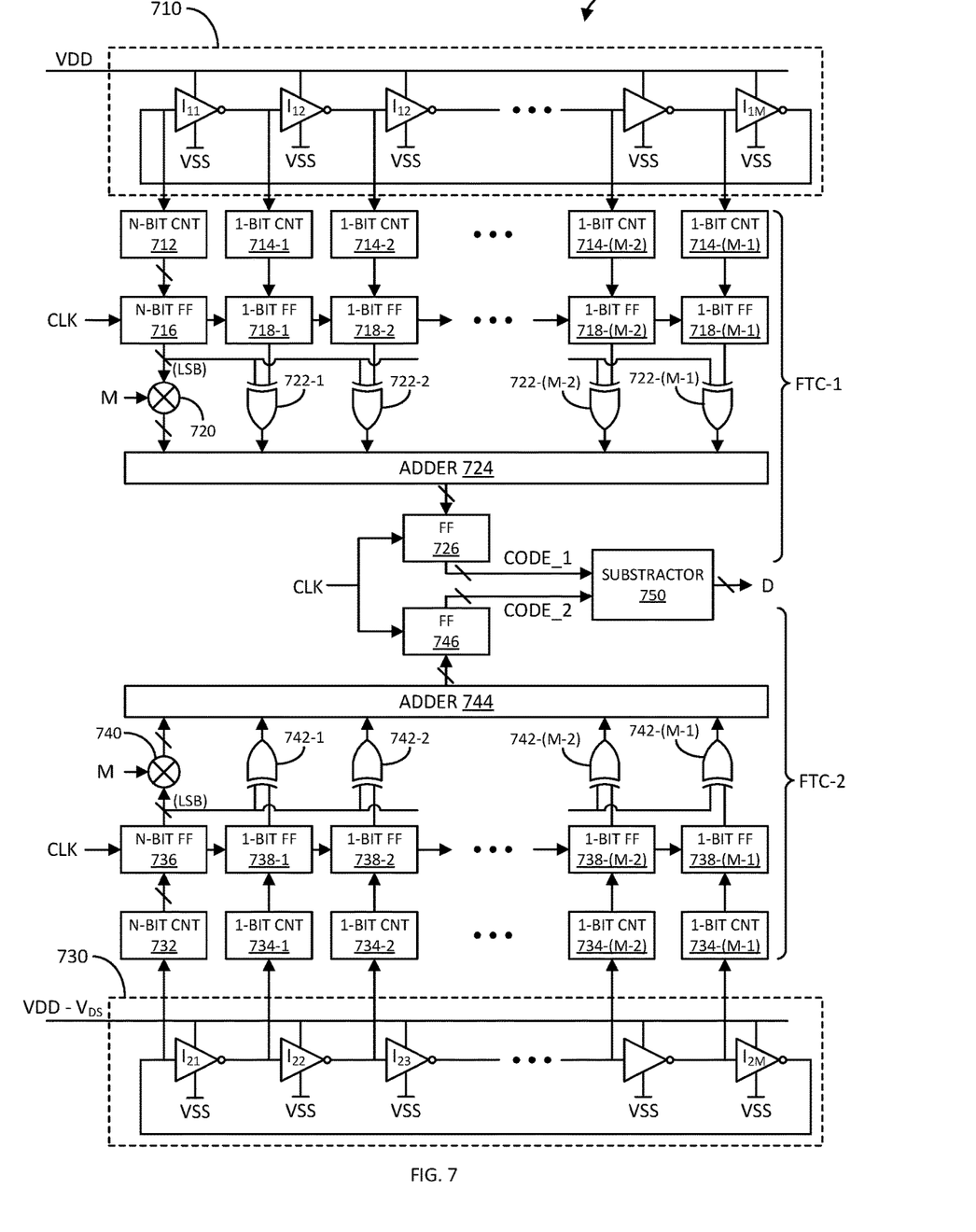
FIG. 7 illustrates a block diagram of an exemplary current sensor in accordance with another aspect of the disclosure.

FIG. 7 illustrates a block diagram of an exemplary current sensor 700 in accordance with another aspect of the disclosure. The current sensor 700 may be an exemplary detailed implementation of any current sensor previously discussed. In this example, the current sensor 700 is particularly configured for sensing a voltage drop across one or more bulk head transistors. However, it shall be understood that the current sensor 700 may be reconfigured for sensing a voltage drop across one or more bulk footer transistors, as discussed in more detail below.

The current sensor 700 includes a first voltage sensor configured to generate a first digital signal CODE_1 indicative or related to a voltage difference between voltages at first and second voltage rails VDD and VSS (e.g., CODE_1~VDD–VSS). The first voltage sensor includes a ring oscillator 710, N-bit counter 712, 1-bit counters 714-1 to 714-(M–1), N-bit flip-flop 716, 1-bit flip-flops 718-1 to 718-(M–1), multiplier 720, exclusive-OR gates 722-1 to 722-(M–1), adder 724, and a flip-flop 726.

The ring oscillator 710 is configured to generate a signal with a frequency that varies as a function of the voltage difference VDD–VSS. The ring oscillator 710 includes a set of cascaded inverters $I_{11}$ to $I_{1M}$. The output of the last inverter $I_{1M}$ is coupled to the input of the first inverter $I_{11}$ via a feedback path. The inverters are coupled between the first voltage rail VDD and the second voltage rail VSS.

The N-bit counter 712 includes an input coupled to the input of the first inverter $I_{11}$. The 1-bit counters 714-1 to 714-(M–1) include inputs coupled to the inputs of inverters $I_{22}$ to $I_{1M}$, respectively. The N-bit flip-flop 716 includes a data input coupled to an output of the N-bit counter 712. The 1-bit flip-flops 718-1 to 718-(M–1) include data inputs coupled to outputs of 1-bit counters 714-1 to 714-(M–1), respectively. The N-bit bit flip-flop 716 and the 1-bit flip-flops 718-1 to 718-(M–1) include clock inputs configured to receive clock signal CLK.

The multiplier 720 includes a first input coupled to an output of the N-bit flip-flop 716. The multiplier 720 includes a second input configured to receive an integer number M (e.g., the same as the number of inverters in the ring oscillator 710). The exclusive OR-gates 722-1 to 722-(M–1) include respective first inputs coupled to the least significant bit (LSB) of the output of the N-bit flip-flop 716. The exclusive OR-gates 722-1 to 722-(M–1) include respective second inputs coupled to the outputs of the 1-bit flip-flops 718-1 to 718-(M–1), respectively.

The multiplier 720 and the exclusive-OR gates 722-1 to 722-(M–1) include outputs coupled to inputs of the adder 724, respectively. The flip-flop 726 includes a data input coupled to an output of the adder 724, and a clock input configured to receive the clock signal CLK. The flip-flop 726 includes an output configured to generate the digital signal CODE_1 related to the voltage difference between the voltages at the first and second voltage rails VDD and VSS.

The current sensor 700 includes a second voltage sensor configured to generate a second digital value CODE_2 indicative or related to a voltage difference between a voltage VDD-$V_{DS}$ at a source of one or more bulk head transistors and a voltage at the second voltage rail VSS (e.g., CODE_1~(VDD–$V_{DS}$)–VSS). The second voltage sensor includes a ring oscillator 730, N-bit counter 732, 1-bit counters 734-1 to 734-(M–1), N-bit flip-flop 736, 1-bit flip-flops 738-1 to 738-(M–1), multiplier 740, exclusive-OR gates 742-1 to 742-(M–1), adder 744, and flip-flop 746.

The ring oscillator 730 is configured to generate a signal with a frequency that varies as a function of the voltage difference (VDD–$V_{DS}$)–VSS. The ring oscillator 730 includes a set of cascaded inverters $I_{21}$ to $I_{2M}$. The output of the last inverter $I_{2M}$ is coupled to the input of the first inverter $I_{21}$ via a feedback path. The inverters $I_{21}$ to $I_{2M}$ are coupled between the sources of the one or more bulk head transistors (e.g., at VDD-$V_{DS}$) and the second voltage rail VSS.

The N-bit counter 732 includes an input coupled to the input of the first inverter $I_{21}$. The 1-bit counters 734-1 to 734-(M−1) include inputs coupled to the inputs of inverters $I_{22}$ to $I_{2M}$, respectively. The N-bit flip-flop 736 includes a data input coupled to an output of the N-bit counter 732. The 1-bit flip-flops 738-1 to 738-(M−1) include data inputs coupled to outputs of 1-bit counters 734-1 to 734-(M−1), respectively. The N-bit bit flip-flop 736 and the 1-bit flip-flops 738-1 to 738-(M−1) include clock inputs configured to receive clock signal CLK.

The multiplier 740 includes a first input coupled to an output of the N-bit flip-flop 736. The multiplier 740 includes a second input configured to receive an integer number M (e.g., the same as the number of inverters in the ring oscillator 730). The exclusive OR-gates 742-1 to 742-(M−1) include respective first inputs coupled to the LSB of the output of the N-bit flip-flop 736. The exclusive OR-gates 742-1 to 742-(M−1) include respective second inputs coupled to the outputs of the 1-bit flip-flops 738-1 to 738-(M−1), respectively.

The multiplier 740 and the exclusive-OR gates 742-1 to 742-(M−1) include outputs coupled to inputs of the adder 744, respectively. The flip-flop 746 includes a data input coupled to an output of the adder 744, and a clock input configured to receive the clock signal CLK. The flip-flop 746 includes an output configured to generate the digital signal CODE_2 related to the voltage difference (VDD−$V_{DS}$)−VSS).

The current sensor 700 further includes a subtractor 750 configured to generate a digital value D related to a difference between digital values CODE_1 and CODE_2 (e.g., D~CODE_1−CODE_2). Since digital value CODE_1 is related to the voltage VDD and CODE_2 is related to the voltage VDD−$V_{DS}$, the digital value D is to $V_{DS}$ (e.g., D~$V_{DD}$−(VDD−$V_{DS}$)=$V_{DS}$). As $V_{DS}$ may be across one or more bulk head transistors, the voltage $V_{DS}$ and, in turn, the digital value D is related to the load current through the bulk head transistors.

As discussed, the current sensor 700 may be reconfigured to sense load current across one or more bulk footer transistors. In this regard, the inverters $I_{21}$ to $I2_M$ of the inverter 730 may be coupled between VDD and $V_{DS}$, where $V_{DS}$ is the drain-to-source voltage of the one or more bulk footer transistors.

The current sensor 700 operates as follows: the ring oscillator 710 generates a signal having a frequency related to the voltage VDD. The N-bit counter 712 (e.g., 4-bit) is a coarse counter. The 1-bit counters 714-1 to 714-(M−1) are for fine counting. Based on the clock signal CLK, the N-bit flip-flop 716 and the 1-bit flip-flops 718-1 to 718-(M−1) latch the values at the outputs of the N-bit counter 712 and 714-1 to 714-(M−1), respectively. The multiplier 720 multiplies the output of the N-bit flip-flop 716 by the value M (e.g., 17). The exclusive OR-gates 722-1 to 722-(M−1) ensure that the fractional value is added to the output of the multiplier 720 by the adder 724. The flip-flop 726 latches the value at the output of the adder 724 based on the clock signal CLK to generate the digital signal CODE_1.

Similarly, the ring oscillator 730 generates a signal having a frequency related to the voltage VDD−$V_{DS}$. The N-bit counter 732 (e.g., 4-bit) is a coarse counter. The 1-bit counters 734-1 to 734-(M−1) are for fine counting. Based on the clock signal CLK, the N-bit flip-flop 736 and the 1-bit flip-flops 738-1 to 738-(M−1) latch the values at the outputs of the N-bit counter 712 and 714-1 to 714-(M−1), respectively. The multiplier 740 multiplies the output of the flip-flop 746 by the value M (e.g., 17). The exclusive OR-gates 742-1 to 742-(M−1) ensure that the fractional value is added to the output of the multiplier 740 by the adder 744. The flip-flop 746 latches the value at the output of the adder 744 based on the clock signal CLK to generate the digital signal CODE_2.

The subtractor 750 generates the difference between CODE_1 and CODE_2 to generate the digital value D related to the load current supplied to a core or circuit.

Figure 8:
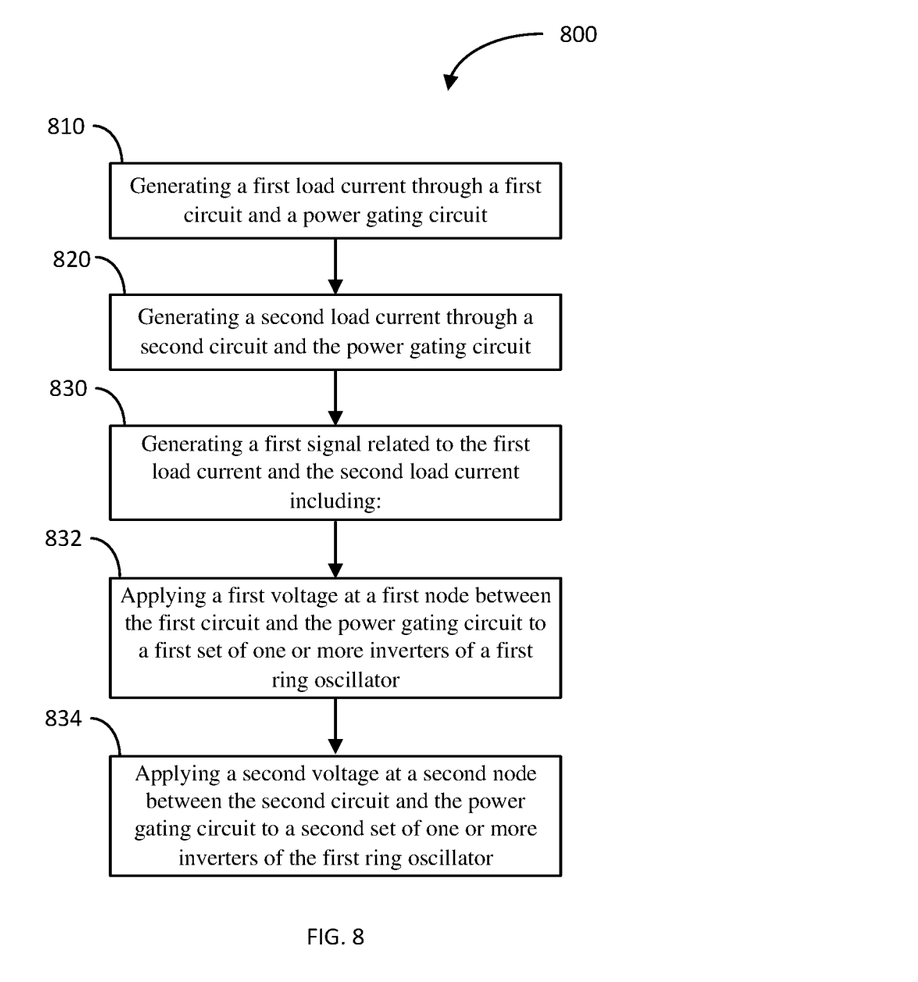
FIG. 8 illustrates a flow diagram of an exemplary method for sensing distributed load currents in accordance with another aspect of the disclosure.

FIG. 8 illustrates a flow diagram of an exemplary method 800 for sensing distributed load currents by a power gating circuit in accordance with another aspect of the disclosure.

The method 800 includes generating a first load current through a first circuit and a power gating circuit (block 810). Examples of means for generating a first load current through a first circuit includes any of the power gating circuits described herein.

The method 800 further includes generating a second load current through a second circuit and the power gating circuit (block 820). Examples of means for generating a second load current through a second circuit includes any of the power gating circuits described herein.

Additionally, the method 800 includes generating a first signal related to the first load current and the second load current (block 832). Examples of means for generating a first signal related to the first load current and the second load current include any of the current sensors described herein.

The generating the first signal in block 830 of the method 800 includes applying a first voltage at a first node between the first circuit and the power gating circuit to a first set of one or more inverters of a first ring oscillator (block 832). Examples of means for applying a first voltage at a first node between the first circuit and the means for generating the first load current to a first set of one or more inverters of a first ring oscillator include any connection between a power gating circuit and one or more inverters of the ring oscillators described herein.

Similarly, the generating the first signal in block 830 of the method 800 also includes applying a second voltage at a second node between the second circuit and the power gating circuit to a second set of one or more inverters of the first ring oscillator (block 834). Examples of means for applying a second voltage at a first node between the first circuit and the means for generating the second load current to a first set of one or more inverters of a first ring oscillator include any connection between a power gating circuit and one or more inverters of the ring oscillators described herein.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples described herein but is to be accorded the widest scope consistent with the principles and novel features disclosed herein.

What is claimed is:

1. An apparatus, comprising:
   a first circuit;
   a second circuit;
   a power gating circuit configured to generate a first load current through the first circuit and a second load current through the second circuit; and
   a current sensor configured to generate a first signal related to the first load current and the second load current, wherein the current sensor includes a first ring oscillator, wherein the first ring oscillator comprises:

a first set of one or more inverters coupled to a first node between the power gating circuit and the first circuit, and
a second set of one or more inverters coupled to a second node between the power gating circuit and the second circuit, wherein the one or more inverters of the first set are cascaded with the one or more inverters of the second set to form at least a portion of a single ring of inverters.

2. The apparatus of claim 1, wherein the first ring oscillator is configured to generate a second signal with a first frequency related to a first voltage difference between a first rail voltage at a first voltage rail and a first voltage at the first node, and a second voltage difference between the first rail voltage and a second voltage at the second node, wherein the first signal is based on the second signal.

3. The apparatus of claim 2, wherein the power gating circuit comprises:
a first set of one or more transistors coupled between the first voltage rail and the first node, wherein the first set of one or more transistors is configured to generate the first load current through the first circuit based on a control signal; and
a second set of one or more transistors coupled between the first voltage rail and the second node, wherein the second set of one or more transistors is configured to generate a second load current through the second circuit based on the control signal.

4. The apparatus of claim 3, wherein the first and second sets of transistors each comprise a p-channel metal oxide semiconductor (PMOS) field effect transistor (FET).

5. The apparatus of claim 3, wherein the first and second sets of transistors each comprise an n-channel metal oxide semiconductor (NMOS) field effect transistor (FET).

6. The apparatus of claim 2, wherein the current sensor comprises a second ring oscillator configured to generate a third signal with a second frequency related to a third voltage difference between the first rail voltage and a second rail voltage, wherein the first signal is based on the third signal.

7. The apparatus of claim 6, wherein the current sensor further comprises:
a first frequency-to-code (FTC) converter configured to generate a first digital signal related to the first frequency;
a second frequency-to-code (FTC) converter configured to generate a second digital signal related to the second frequency; and
a subtractor configured to generate the first signal based on a difference between the first digital signal and the second digital signal.

8. The apparatus of claim 2, wherein the current sensor further comprises a frequency-to-code (FTC) converter configured to generate a first digital signal related to the first frequency.

9. The apparatus of claim 8, wherein the frequency-to-code (FTC) converter comprises:
an n-bit counter coupled to an input of one of the inverters;
a set of 1-bit counters coupled to inputs of the remaining inverters, respectively;
an n-bit flip-flop configured to latch an output of the n-bit counter based on a clock signal; and
a set of 1-bit flip-flops configured to latch outputs of the 1-bit counters based on the clock signal, respectively.

10. An apparatus, comprising:
a first circuit;
a second circuit;
a power gating circuit configured to generate a first load current through the first circuit and a second load current through the second circuit; and
a current sensor configured to generate a first signal related to the first load current and the second load current, wherein the current sensor includes a first ring oscillator comprising:
a first set of one or more inverters coupled to a first node between the power gating circuit and the first circuit, and
a second set of one or more inverters coupled to a second node between the power gating circuit and the second circuit;
wherein the first ring oscillator is configured to generate a second signal with a first frequency related to a first voltage difference between a first rail voltage at a first voltage rail and a first voltage at the first node, and a second voltage difference between the first rail voltage and a second voltage at the second node, wherein the first signal is based on the second signal;
wherein the current sensor further comprises a frequency-to-code (FTC) converter configured to generate a first digital signal related to the first frequency;
wherein the FTC converter comprises:
an n-bit counter coupled to an input of one of the inverters;
a set of 1-bit counters coupled to inputs of the remaining inverters, respectively;
an n-bit flip-flop configured to latch an output of the n-bit counter based on a clock signal;
a set of 1-bit flip-flops configured to latch outputs of the 1-bit counters based on the clock signal, respectively;
a multiplier configured to generate a coarse digital value related to the first frequency by multiplying by an integer number to the latched output of the n-bit flip-flip;
a set of exclusive-OR gates to collectively generate a fine digital value of the first frequency, the set of exclusive-OR gates including respective first inputs coupled to a least significant bit of the n-bit flip-flop and respective second inputs configured to receive the latched outputs of the 1-bit flip-flop, respectively; and
an adder to add the coarse digital value to the fine digital value to generate the second signal.

11. A method, comprising:
generating a first load current through a first circuit and a power gating circuit;
generating a second load current through a second circuit and the power gating circuit; and
generating a first signal related to the first load current and the second load current, wherein generating the first signal comprises:
applying a first voltage at a first node between the first circuit and the power gating circuit to a first set of one or more inverters of a first ring oscillator; and
applying a second voltage at a second node between the second circuit and the power gating circuit to a second set of one or more inverters of the first ring oscillator, wherein the one or more inverters of the first set are cascaded with the one or more inverters of the second set to form at least a portion of a single ring of inverters.

12. The method of claim 11, wherein generating the first signal comprises the first ring oscillator generating a second signal with a first frequency related to a first voltage difference between a first rail voltage at a first voltage rail and the first voltage, and a second voltage difference between the first rail voltage and the second voltage.

13. The method of claim 12, wherein generating the first load current comprises:
   turning on a first set of one or more transistors coupled between the first voltage rail and the first node based on a control signal; and
   turning on a second set of one or more transistors coupled between the first voltage rail and the second node based on the control signal.

14. The method of claim 13, wherein the first and second sets of transistors each comprise a p-channel metal oxide semiconductor (PMOS) field effect transistor (FET).

15. The method of claim 13, wherein the first and second sets of transistors each comprise an n-channel metal oxide semiconductor (NMOS) field effect transistor (FET).

16. The method of claim 12, wherein generating the first signal comprises a second ring oscillator generating a third signal with a second frequency related to a third voltage difference between the first rail voltage and a second rail voltage.

17. The method of claim 16, wherein generating the first signal further comprises:
   generating a first digital signal related to the first frequency;
   generating a second digital signal related to the second frequency; and
   generating a difference between the first digital signal and the second digital signal, wherein the first signal is based on the difference.

18. The method of claim 12, wherein generating the first signal comprises generating a first digital signal related to the first frequency.

19. An apparatus, comprising:
   means for generating a first load current through a first circuit;
   means for generating a second load current through a second circuit; and
   means for generating a first signal related to the first load current and the second load current, wherein the means for generating the first signal comprises:
      means for applying a first voltage at a first node between the first circuit and the means for generating the first load current to a first set of one or more inverters of a means for generating a second signal; and
      means for applying a second voltage at a second node between the second circuit and the means for generating the second load current to a second set of one or more inverters of the means for generating the second signal, wherein the one or more inverters of the first set are cascaded with the one or more inverters of the second set to form at least a portion of a single ring of inverters.

20. The apparatus of claim 19, wherein the means for generating the second signal comprises means for generating the second signal with a first frequency related to a first voltage difference between a first rail voltage at a first voltage rail and the first voltage, and a second voltage difference between the first rail voltage and the second voltage.

21. The apparatus of claim 20, wherein the means for generating the first load current comprises:
   means for turning on a first set of one or more transistors coupled between the first voltage rail and the first node based on a control signal; and
   means for turning on a second set of one or more transistors coupled between the first voltage rail and the second node based on the control signal.

22. The method of claim 21, wherein the first and second sets of transistors each comprise a p-channel metal oxide semiconductor (PMOS) field effect transistor (FET).

23. The method of claim 21, wherein the first and second sets of transistors each comprise an n-channel metal oxide semiconductor (NMOS) field effect transistor (FET).

24. The method of claim 20, wherein the means for generating the first signal comprises means for generating a third signal with a second frequency related to a third voltage difference between the first rail voltage and a second rail voltage.

25. The apparatus of claim 24, wherein the means for generating the first signal further comprises:
   means for generating a first digital signal related to the first frequency;
   means for generating a second digital signal related to the second frequency; and
   means for generating a difference between the first digital signal and the second digital signal, wherein the first signal is based on the difference.

26. The apparatus of claim 20, wherein the means for generating the first signal comprises means for generating a first digital signal related to the first frequency.

* * * * *

UNITED STATES PATENT AND TRADEMARK OFFICE
CERTIFICATE OF CORRECTION

PATENT NO. : 10,382,034 B2
APPLICATION NO. : 15/358494
DATED : August 13, 2019
INVENTOR(S) : Guoan Zhong et al.

It is certified that error appears in the above-identified patent and that said Letters Patent is hereby corrected as shown below:

In the Claims

Claim 10, Line 37, the term "n-bit flip-flip" is replaced with "n-bit flip-flop".
Claim 22, Line 24, the term "method" is replaced with "apparatus".
Claim 23, Line 27, the term "method" is replaced with "apparatus".
Claim 24, Line 30, the term "method" is replaced with "apparatus".

Signed and Sealed this
Twenty-eighth Day of January, 2020

Andrei Iancu
*Director of the United States Patent and Trademark Office*